(12) United States Patent
Wu

(10) Patent No.: US 8,288,261 B1
(45) Date of Patent: Oct. 16, 2012

(54) METHOD FOR PREPARING CONTACT PLUG STRUCTURE

(75) Inventor: Chang Ming Wu, Zhonghe (TW)

(73) Assignee: Nanya Technology Corporation (TW)

( * ) Notice: Subject to any disclaimer, the term of this patent is extended or adjusted under 35 U.S.C. 154(b) by 53 days.

(21) Appl. No.: 13/093,008

(22) Filed: Apr. 25, 2011

(51) Int. Cl.
*H01L 21/3205* (2006.01)
*H01L 21/4763* (2006.01)
*H01L 29/12* (2006.01)
*H01L 29/786* (2006.01)

(52) U.S. Cl. . 438/586; 438/629; 438/637; 257/E21.646; 257/E27.084; 257/71

(58) Field of Classification Search ............... 438/586, 438/629, 637–640; 257/71, E27.084, E21.646
See application file for complete search history.

(56) References Cited

U.S. PATENT DOCUMENTS

| 6,734,485 | B2 * | 5/2004 | Wu | 257/301 |
| 2009/0026515 | A1 * | 1/2009 | Shin et al. | 257/296 |
| 2010/0148236 | A1 * | 6/2010 | Kadoya | 257/306 |

* cited by examiner

*Primary Examiner* — Leonard Chang
(74) *Attorney, Agent, or Firm* — Connolly Bove Lodge & Hutz LLP

(57) ABSTRACT

In a further embodiment of the present invention, a method for preparing a contact structure includes the steps of forming a conductive stack on the semiconductor substrate; forming a patterned mask on the conductive stack; forming a depression in an upper portion of the conductive stack; forming a spacer layer on the surface of the depression and the patterned mask; forming a mask block filling the depression; removing a portion of the spacer layer not covered by the mask block; and removing a portion of the conductive stack by using the mask block and the patterned mask to form the contact structure including at least one tall contact plug under the patterned mask and at least one the short contact plug under the mask block.

15 Claims, 9 Drawing Sheets

METHOD FOR PREPARING CONTACT PLUG STRUCTURE

TECHNICAL FIELD

The present invention relates to a method for preparing an integrated circuit structure, and more particularly, to a method for preparing an contact plug structure with lower contact resistance for dynamic random access memories.

BACKGROUND

Due to structural simplicity, DRAMs (dynamic random access memories) can provide more memory cells per unit chip area than other types of memories such as static random access memories. A DRAM is constituted by a plurality of DRAM cells, each of which includes a capacitor for storing information and a transistor coupled to the capacitor for regulating when the capacitor is charged or discharged. During a read operation, a word line is asserted, turning on the transistor. The enabled transistor allows the voltage across the capacitor to be read by a sense amplifier through a bit line. During a write operation, the data to be written is provided on the bit line while the word line is asserted.

To satisfy the demand for greater memory storage, DRAM memory cells need size reduction. DRAM memory cell size can be reduced in several ways. One way is to reduce the minimum feature size of a DRAM memory cell through the advances in process technology. Another way to reduce the size of a DRAM memory cell is by designing a memory cell having a smaller feature size. For example, many DRAM chips on the market today have a memory cell size of $4F^2$, where F stands for the photolithographic minimum feature width or critical dimension (CD).

FIG. 1 and FIG. 2 illustrate a method for preparing a dynamic random access memory structure 10 according to prior art. First, fabrication processes are performed to form a substrate 19, and a dielectric structure 21 overlaying the substrate 19 is then formed by the deposition process. In particular, the substrate 19 includes a semiconductor substrate 11 with a shallow trench isolation 13, recessed gates 15, and doped regions 17 in the semiconductor substrate 11. Subsequently, fabrication process is performed to form conductive lines 31 serving as word lines on the recess gates 15, and spacer structures 33 on the sidewall of the conductive lines 31.

The forming of the dielectric structure 21 includes the steps of forming a first insulation layer 23 such as an oxide layer overlaying the substrate 19, forming a bit-line contact plug 27 in the first insulation layer 23 and connected to one of the doped regions 17, forming a second insulation layer 25 such as a boro-phospho-silicate glass (BPSG) layer overlaying the first insulation layer 16, and forming a bit line 29 in the second insulation layer 25 and connected to the bit-line contact plug 27. The bit-line contact plug 27 and the bit line 29 are shown as a dashed line to emphasize that the bit-line contact plug 27 and the bit line 29 are buried in the dielectric structure 21. Subsequently, a capacitor contact plug 35 is formed in the dielectric structure 21 and connects to one of the doped regions 17, as shown in FIG. 2.

However, the bit-line contact plug 27 and capacitor contact plug 35 both are cone-shaped, and the contact area between the doped regions 17 and the bit-line contact plug 27 (and capacitor contact plug 35) is the minimum, and the contact resistance increases as the contact area decrease. In other words, the bit-line contact plug 27 and capacitor contact plug 35 fabricated by the conventional technical can not meet the demand for greater memory storage of DRAM due to the higher contact resistance.

SUMMARY

One aspect of the present invention provides a method for preparing a non-cone shaped contact plug structure with lower contact resistance for dynamic random access memories.

In one embodiment of the present invention, a method for preparing an integrated circuit structure comprises the steps of form gin a gate conductor in a semiconductor substrate; forming a conductive stack on the semiconductor substrate; forming a depression in an upper portion of the conductive stack; forming a spacer layer at least on the surface of the depression; forming a mask block filling the depression; removing a portion of the spacer layer not covered by the mask block; and removing a bottom portion of the conductive stack not covered by the mask block to expose the gate conductor.

In another embodiment of the present invention, a method for preparing a contact structure comprises the steps of forming a conductive stack on the semiconductor substrate; forming a patterned mask on the conductive stack; forming a depression in an upper portion of the conductive stack; forming a spacer layer on the surface of the depression and the patterned mask; forming a mask block filling the depression; removing a portion of the spacer layer not covered by the mask block; and removing a portion of the conductive stack by using the mask block and the patterned mask to form the contact structure including at least one tall contact plug under the patterned mask and at least one the short contact plug under the mask block.

In the prior art, the bit-line contact plug and capacitor contact plug both are cone-shaped, and the contact area between the doped regions and the bit-line contact plug (and capacitor contact plug) is the minimum, and the contact resistance increases as the contact area decrease. In contrast, the tall contact plug serving as the capacitor contact plug, and the short contact plug serving as the bit line contact plug are rectangular rather than the cone-shaped, i.e., the contact areas of the tall contact plug and the short contact plug are increased as compared to the bit-line contact plug and capacitor contact plug in the prior art. Consequently, the tall contact plug and the short contact plug possesses a lower contact resistance and can meet the demand for greater memory storage of DRAM.

The foregoing has outlined rather broadly the features of the present invention in order that the detailed description of the invention that follows may be better understood. Additional features of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives of the present invention will become apparent upon reading the following description and upon reference to the accompanying drawings in which.

DETAILED DESCRIPTION

Figure 3:
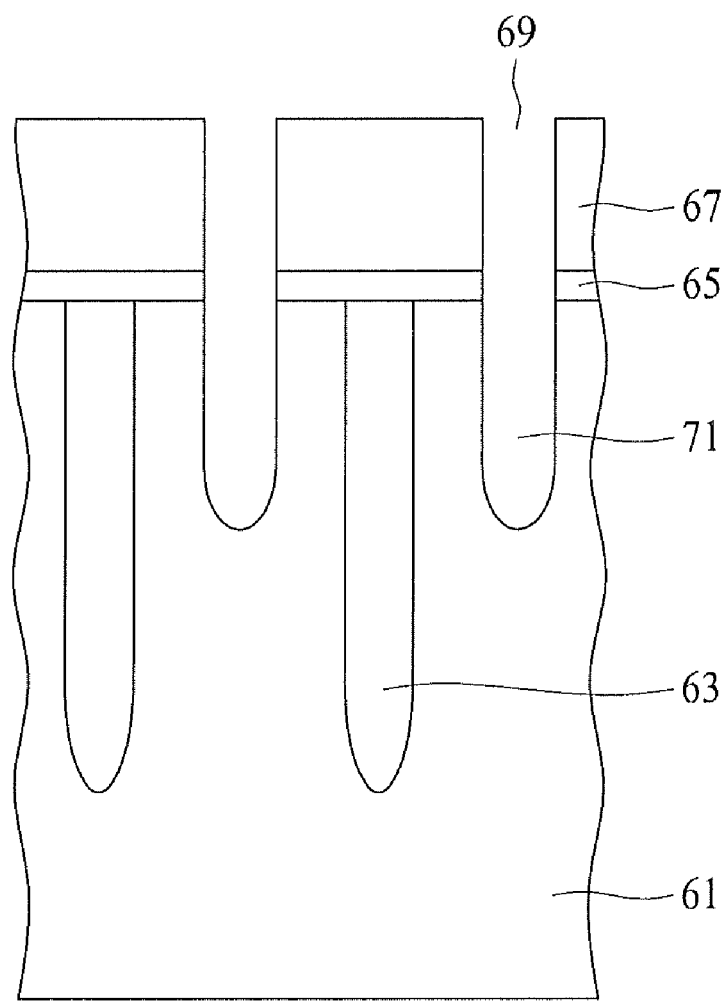
FIG. 3 to FIG. 9 are cross-sectional views showing the fabrication process of an integrated circuit structure for the 4F2 memory cells according to one embodiment of the present invention.

FIG. 3 is a cross-sectional view shown the formation of a plurality of recesses 71 in a semiconductor substrate 61 according to one embodiment of the present invention. In one embodiment of the present invention, a pad oxide layer 65 is formed on the semiconductor substrate 61 with a trench isolation structure 63, and an etching mask 67 having a plurality of openings 69 is then formed on the pad oxide layer 65. Subsequently, a dry etching process is performed to remove a portion of the semiconductor substrate 61 under the openings 69 of the etching mask 67 so as to form a plurality of recesses 71 in the semiconductor substrate 61.

Figure 4:
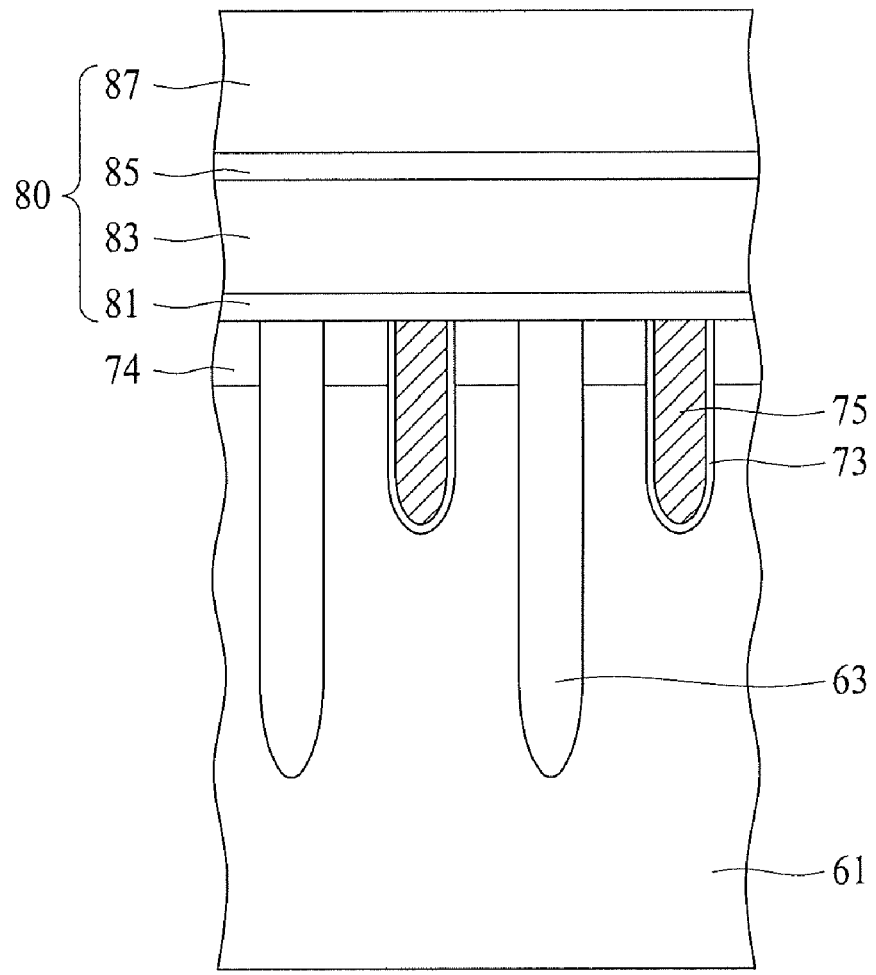

FIG. 4 is a cross-sectional view shown the formation of a conductive stack 80 on semiconductor substrate 61 according to one embodiment of the present invention. In one embodiment of the present invention, the pad oxide layer 65 and the etching mask 67 are stripped, and a thermal oxide layer is then formed on the surface of the recesses 71 by the thermal oxidation process; subsequently, a gate dielectric layer 73 is formed on the surface of the recesses, the recesses 71 are the filled with conductive material to form gate conductors 75 in a semiconductor substrate 61, and deposition process is then performed to form the conductive stack 80 on the semiconductor substrate 61. In one embodiment of the present invention, the conductive stack comprises a first interlayer 81 on the semiconductor substrate 61, a first conductive layer 83 on the on the first interlayer 81, a second interlayer 85 on the first conductive layer 83, and a second conductive layer 87 on the second interlayer 85.

Figure 5:
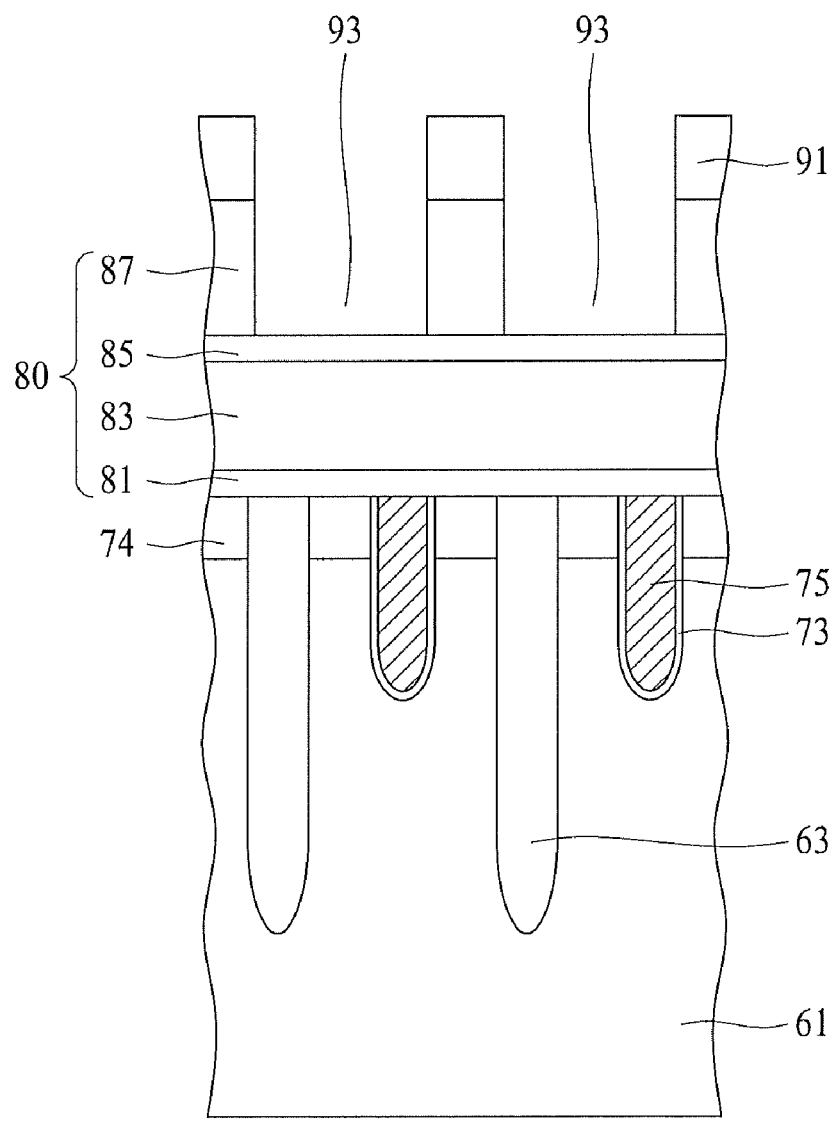

FIG. 5 is a cross-sectional view shown the formation of at least one depression 93 in the conductive stack 80 according to one embodiment of the present invention. In one embodiment of the present invention, the first interlayer 81 includes titanium/titanium nitride, the first conductive layer 83 includes tungsten, the second interlayer 85 includes titanium/titanium nitride, and the second conductive layer 87 includes tungsten. In one embodiment of the present invention, a patterned mask 91 is formed on the conductive stack 80, and a dry etching process is then performed to remove an upper portion of the conductive stack 80 (the second conductive layer 87) so as to form the depression 93.

Figure 6:
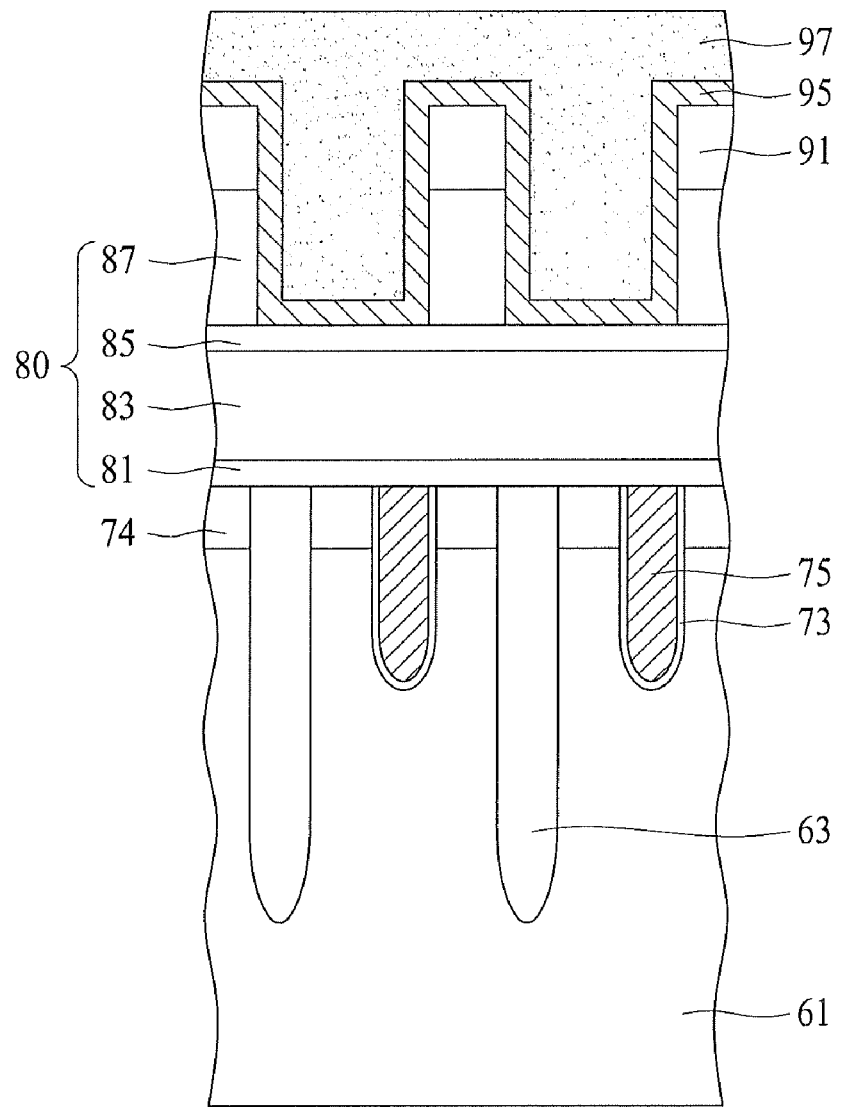

FIG. 6 is a cross-sectional view shown the formation of a spacer layer 95 and a mask layer 97 according to one embodiment of the present invention. In one embodiment of the present invention, a deposition process is performed to form the spacer layer 95 such as the polysilicon layer on the surface of the depression 93 and the patterned mask 91, and a coating process is then performed to form the mask layer 97 such as the photoresist layer on the spacer layer 95, wherein the mask layer 97 fills the depression 93.

Figure 7:
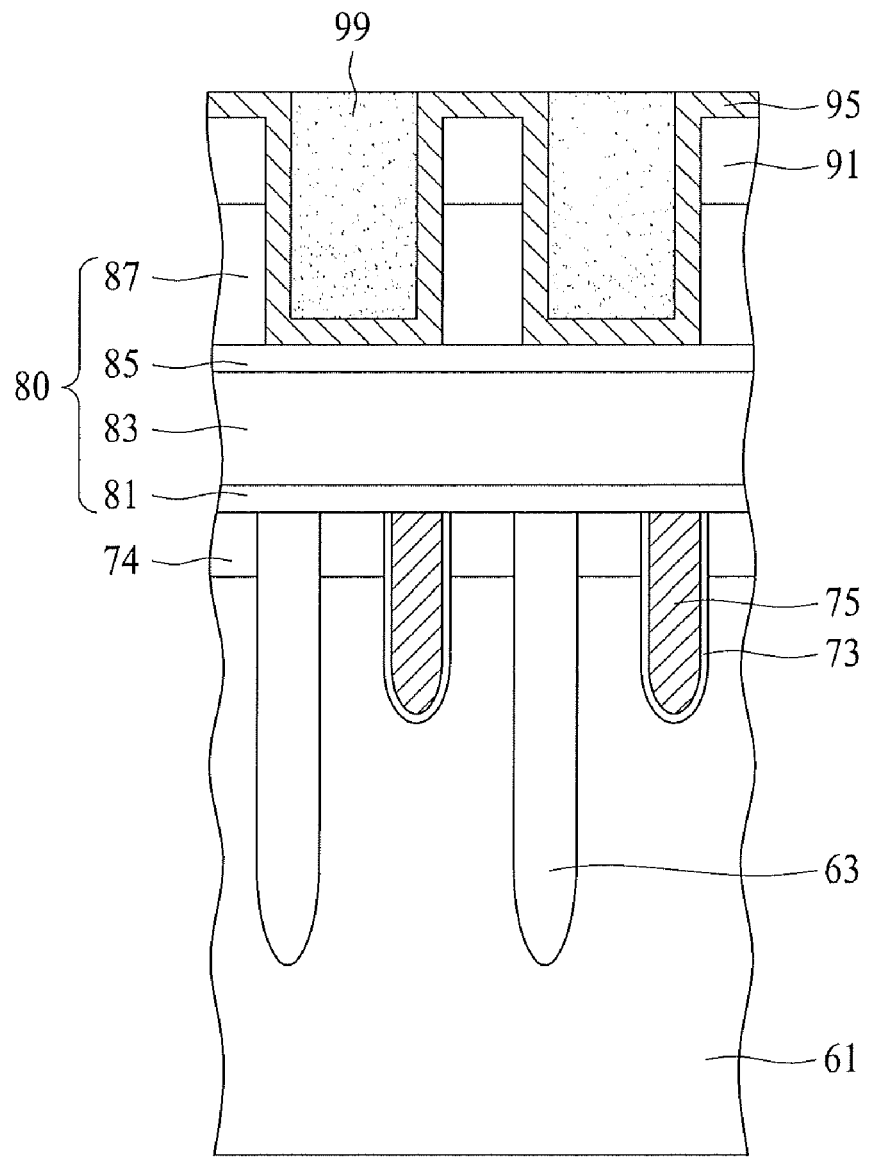

FIG. 7 is a cross-sectional view shown the formation of a mask block 99 according to one embodiment of the present invention. In one embodiment of the present invention, a planarization process such as the dry etching process is performed to remove a portion of the mask layer 97 above the spacer layer 95 on the patterned mask 91 to form the mask block 99, wherein the etching process using the spacer layer 95 as the etching stop signal.

Figure 8:
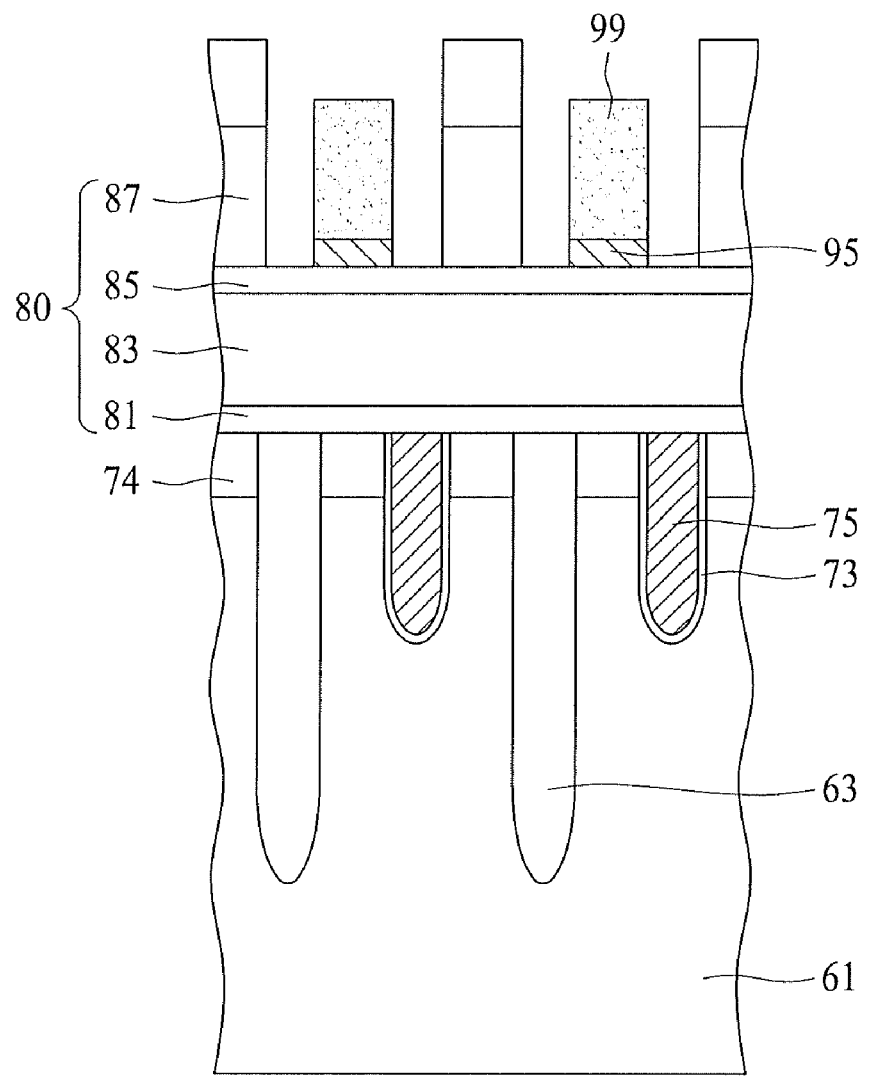

FIG. 8 is a cross-sectional view shown the selective removing of a portion of the spacer layer 95 according to one embodiment of the present invention. In one embodiment of the present invention, a dry etching process is performed to selectively remove a portion of the spacer layer 95 not covered by the mask block 99 by using the second interlayer 85 of the conductive stack 80 as the etching stop signal.

Figure 9:
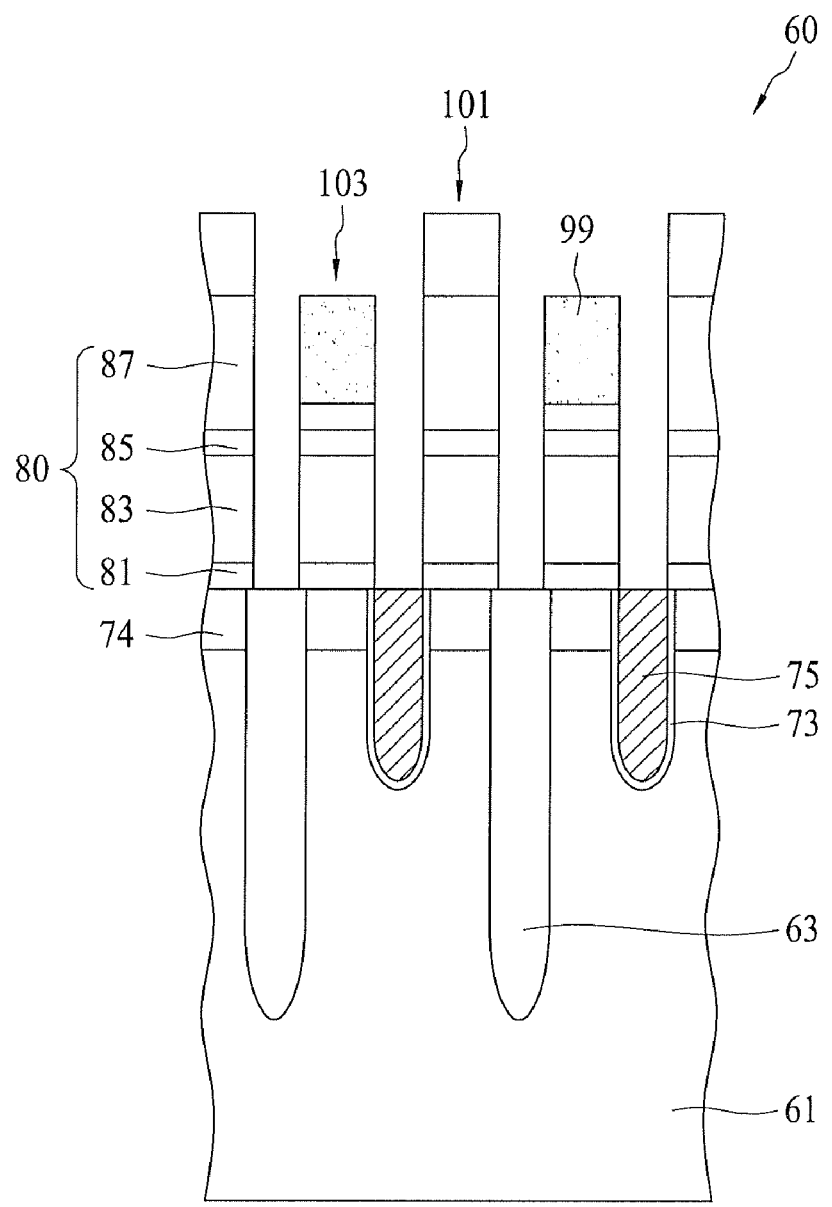

FIG. 9 is a cross-sectional view shown the formation of an integrated circuit structure 60 according to one embodiment of the present invention.

In one embodiment of the present invention, a dry etching process is performed to selectively remove a bottom portion of the conductive stack 80 not covered by the mask block 99 to expose the gate conductor 85. In one embodiment of the present invention, the dry etching process uses the mask block and the patterned mask as the etching mask to form at least one tall contact plug 101 under the patterned mask 91 and at least one short contact plug 103 under the mask block 99. In one embodiment of the present invention, the tall contact plug 101 serves as the capacitor contact plug, and the short contact plug 103 serves as the bit line contact plug.

In the prior art, the bit-line contact plug 27 and capacitor contact plug 35 both are cone-shaped, and the contact area between the doped regions 17 and the bit-line contact plug 27 (and capacitor contact plug 35) is the minimum, and the contact resistance increases as the contact area decrease.

Figure 1:
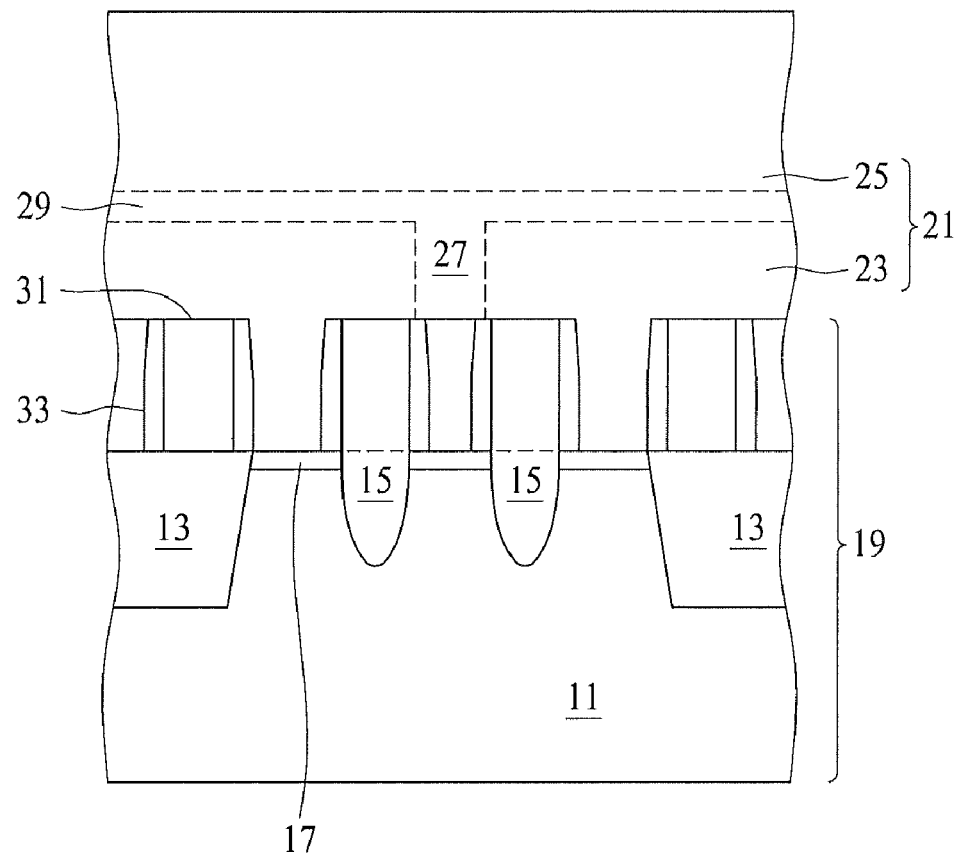
FIG. 1 and FIG. 2 illustrate a method for preparing a dynamic random access memory structure according to prior art.
Figure 2:
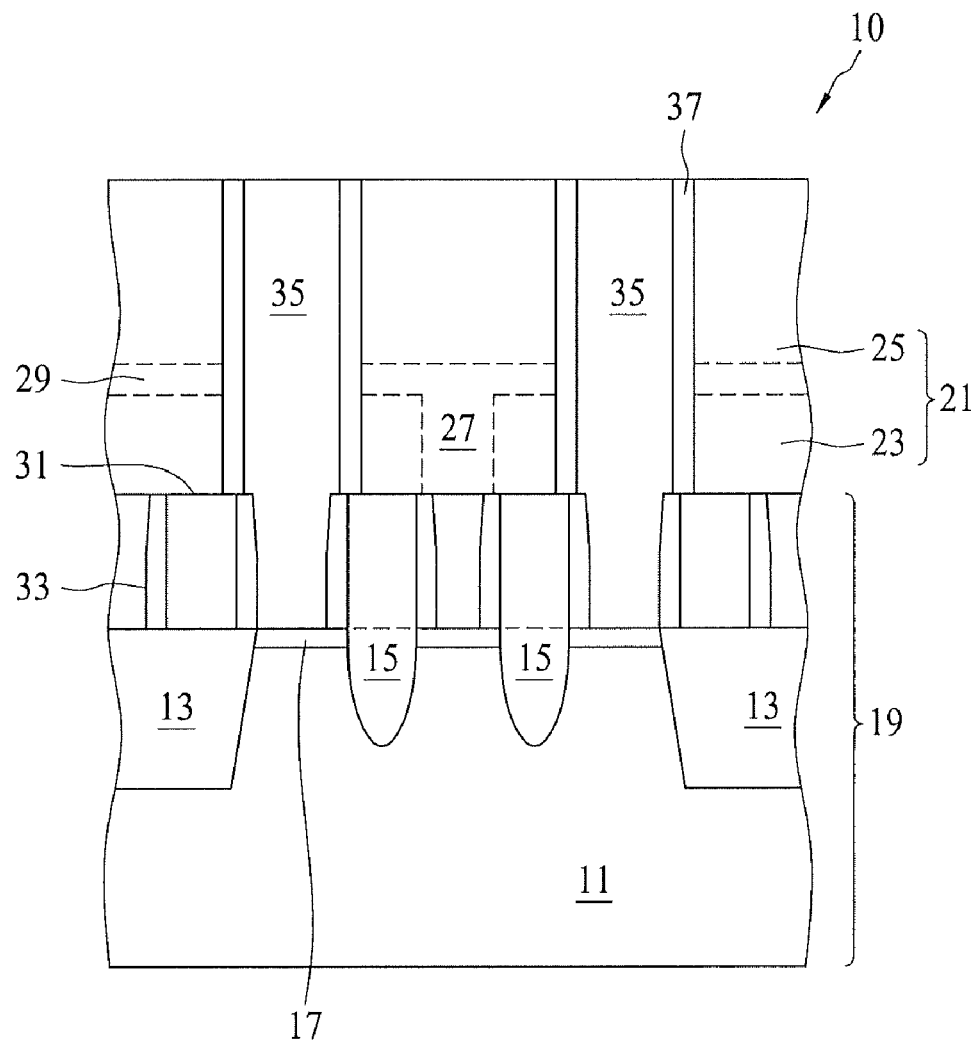

In contrast, the tall contact plug 101 serving as the capacitor contact plug, and the short contact plug 103 serving as the bit line contact plug are rectangular rather than the cone-shaped, i.e., the contact areas of the tall contact plug 101 and the short contact plug 103 are increased as compared to the bit-line contact plug 27 and capacitor contact plug 35 in FIG. 2. Consequently, the tall contact plug 101 and the short contact plug 103 possesses a lower contact resistance and can meet the demand for greater memory storage of DRAM.

Although the present invention and its objectives have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for preparing an integrated circuit structure, comprising the steps of:
   forming a gate conductor in a semiconductor substrate;
   forming a conductive stack on the semiconductor substrate;
   forming a depression in an upper portion of the conductive stack;
   forming a spacer layer at least on the surface of the depression;

forming a mask block filling the depression;
removing a portion of the spacer layer not covered by the mask block; and
removing a bottom portion of the conductive stack not covered by the mask block to expose the gate conductor.

2. The method for preparing an integrated circuit structure of claim 1, wherein the forming of the conductive stack comprising the steps of:
   forming a first interlayer on the semiconductor substrate;
   forming a first conductive layer on the on the first interlayer;
   forming a second interlayer on the first conductive layer; and
   forming a second conductive layer on the second interlayer.

3. The method for preparing an integrated circuit structure of claim 1, wherein the forming of the depression comprises the steps of:
   forming a patterned mask on the conductive stack; and
   performing an etching process to remove a portion of the conductive stack not covered by the patterned mask.

4. The method for preparing an integrated circuit structure of claim 1, wherein the spacer layer includes polysilicon.

5. The method for preparing an integrated circuit structure of claim 1, wherein the forming of the mask block comprises the steps of:
   performing a coating process to form a mask layer on the spacer layer, wherein the mask layer fills the depression; and
   performing a planarization process to remove a portion of the mask layer above the depression.

6. The method for preparing an integrated circuit structure of claim 5, wherein the mask layer includes photoresist.

7. The method for preparing an integrated circuit structure of claim 5, wherein the planarization process is an etching process using the spacer layer as the etching stop signal.

8. The method for preparing an integrated circuit structure of claim 1, wherein the conductive stack comprises a plurality of layers, and the removing of a portion of the spacer layer is an etching process using one layer of the conductive stack as the etching stop signal.

9. A method for preparing a contact plug structure, comprising the steps of:
   forming a conductive stack on a semiconductor substrate;
   forming a patterned mask on the conductive stack;
   forming a depression in an upper portion of the conductive stack;
   forming a spacer layer on the surface of the depression and the patterned mask;
   forming a mask block filling the depression;
   removing a portion of the spacer layer not covered by the mask block; and
   removing a portion of the conductive stack by using the mask block and the patterned mask to form the contact plug structure.

10. The method for preparing a contact plug structure of claim 9 wherein the removing of a portion of the conductive stack by using the mask block and the patterned mask forms at least one tall contact plug under the patterned mask and at least one short contact plug under the mask block.

11. The method for preparing a contact plug structure of claim 10, wherein the forming of the mask block comprises the steps of:
   performing a coating process to form a mask layer on the spacer layer, wherein the mask layer fills the depression; and
   performing a planarization process to remove a portion of the mask layer on the patterned mask.

12. The method for preparing a contact plug structure of claim 11, wherein the mask layer includes photoresist.

13. The method for preparing a contact plug structure of claim 11, wherein the planarization process is an etching process using the spacer layer as the etching stop signal.

14. The method for preparing a contact plug structure of claim 10, wherein the removing of a portion of the spacer layer is an etching process using the interlayer as the etching stop signal.

15. The method for preparing a contact plug structure of claim 9, wherein the spacer layer includes polysilicon.

* * * * *